United States Patent [19]

Detering

[11] 4,173,722
[45] Nov. 6, 1979

[54] DIGITAL PULSE GENERATOR WITH END-STOP DETECTION AND CONTROL

[75] Inventor: Richard L. Detering, Buffalo, N.Y.

[73] Assignee: Westinghouse Electric Corp., Pittsburgh, Pa.

[21] Appl. No.: 886,390

[22] Filed: Mar. 14, 1978

[51] Int. Cl.² .................... H03K 17/72; H03K 5/13
[52] U.S. Cl. ............................ 307/252 Q; 307/262;
307/269; 363/58; 363/96
[58] Field of Search ............... 307/252 N, 252 Q, 262,
307/269; 363/57, 58, 96, 136, 137, 129

[56] References Cited

U.S. PATENT DOCUMENTS

| | | | |
|---|---|---|---|
| 3,562,625 | 2/1971 | Van den Broek | 307/252 N |
| 3,681,676 | 8/1972 | Bourbeau | 307/252 N |
| 3,932,771 | 1/1976 | Bucek et al. | 307/252 N |

Primary Examiner—John Zazworsky
Attorney, Agent, or Firm—C. M. Lorin

[57] ABSTRACT

A firing pulse generator for sequential firing of thyristors digitally synthesizes time dependent references associated in succession with the respective thyristors with a hard pulse, and predetermined critical counts on a time dependent reference are identified representing the first and second end-stops defining the permissible fire-angle range. A substitute for the hard pulse is generated when the hard pulse is advanced, and when it is retarded in relation to predetermined limits, e.g. the end-stops. The time dependent reference is generated over a range sufficient to cover the permissible fire-angle range defined by the end-stops. Blocking of an illegal hard pulse is effected independently from the generation of a hard pulse. Pulse suppression is performed independently from the generation of a hard pulse, or of a substitute pulse.

4 Claims, 10 Drawing Figures

HARD PULSE PICKET

DIGITAL PULSE GENERATOR WITH END-STOP DETECTION AND CONTROL

BACKGROUND OF THE INVENTION

The invention relates to digital pulse generators for sequential firing of thyristors as can be used in static power converters.

With the use of thyristors and the adjunct control techniques, solid state technology and digital treatment of the operative modes have received extensive applications. In particular, as shown in copending patent application Ser. No. 845,741, filed on Oct. 26, 1977 by Gary E. Baumgart for "Translator Module For Interfacing A Sequence Controller With A Remote Source Of Logic Command Signals And Universal Modular Load Control Apparatus Embodying Such Sequence Controller And Translator Module", solid state technology and digital techniques have led to a modular organization of the entire power and control system, for instance, in the designing and manufacturing of a variable voltage and variable frequency static motor drive. In particular, the digital pulse generator igniting in sequence the thyristors of such a motor drive has been conceived as a module which can be added or assembled with other modules, and that can be adjusted and controlled in situ from an operator's panel. Modularization requires a careful selection of solid state components and a compact design. All this tends to facilitate the manufacture of a standard product having improved and well established characteristics at the lowest cost.

The object of the present invention is to provide an improved digital end-stop determination and control in a thyristor gating generator.

The technique for end-stop control is generally described in Chapter 10, pages 259 to 271 of "Thyristor Phase-Controlled Converters and Cycloconverters" of B. R. Pelly (Wiley-Interscience 1971). End-Stop control is intended to insure that firing the "next" thyristor in accordance with a reference signal and timing wave will not occur at a firing angle situated outside the permissible firing angle range, e.g. the range defined by a first (or advanced) end-stop ($ES_1$) and a second (or retarded) end-stop ($ES_2$). The first end-stop ($ES_1$) blocks the generation of any early igniting pulse until the lower limit $ES_1$ has been reached and then generates a gate firing pulse. The second end-stop ($ES_2$) causes a gate firing pulse to occur when the comparator is late in providing the expected firing angle. One such technique has been shown in U.S. Pat. No. 4,028,609 of Richard L. Detering.

The object of the present invention is to provide an improved design, with increased reliability of operation and reduced manufacturing cost. In particular, LSI modular manufacture is more extensively used in the solid state circuitry, uniting on a common chip a maximum number of functions, and gate pulse suppression is also included thereon.

SUMMARY OF THE INVENTION

A digital pulse generator is provided in which a custom LSI design accommodates on a single chip the digital counter associated with an external phase-locked loop oscillator, the synthesization of the phase angle information associated with each thyristor, the distributor for the gate pulses, an end-stop decoder which monitors the digital phase angle information for establishing the end-stops and generating substitute hard pulses, and a gate pulse suppression circuit controlled externally.

A comparator detects the desired fire angle in relation to a synthesized time dependent reference. A hard pulse generator is actuated by the comparator when a transition occurs in the comparator at the required fire angle. The comparator and the hard pulse generator are external to the LSI chip. On the LSI chip are provided (1) an end-stop detector including means responsive to the comparator for generating a pulse substituted for the hard pulse whenever the synthesized time dependent reference indicates the occurrence of the first or the second end-stop, in the absence of a timely hard pulse, and (2) a gating circuit for preventing passing of a hard pulse from the hard pulse generator when the untimely occurrence of a hard pulse is indicated by a count below the first end-stop, or above the second end-stop.

Gate pulse suppression is applied independently from the generation of a hard or substitute pulse by disabling NOR gates in each firing channel to the thyristor, and a set-reset flip-flop type of circuit is provided including NOR gates placed on the LSI chip, in order to prevent gate pulse suppression in the presence of a hard pulse already initiated, or of a picket fence pulse generated after the hard pulse to sustain ignition of the thyristor.

DESCRIPTION OF A DIGITAL PULSE GENERATOR SCHEME OF THE PRIOR ART (U.S. PAT. NO. 4,028,609)

Figure 1:
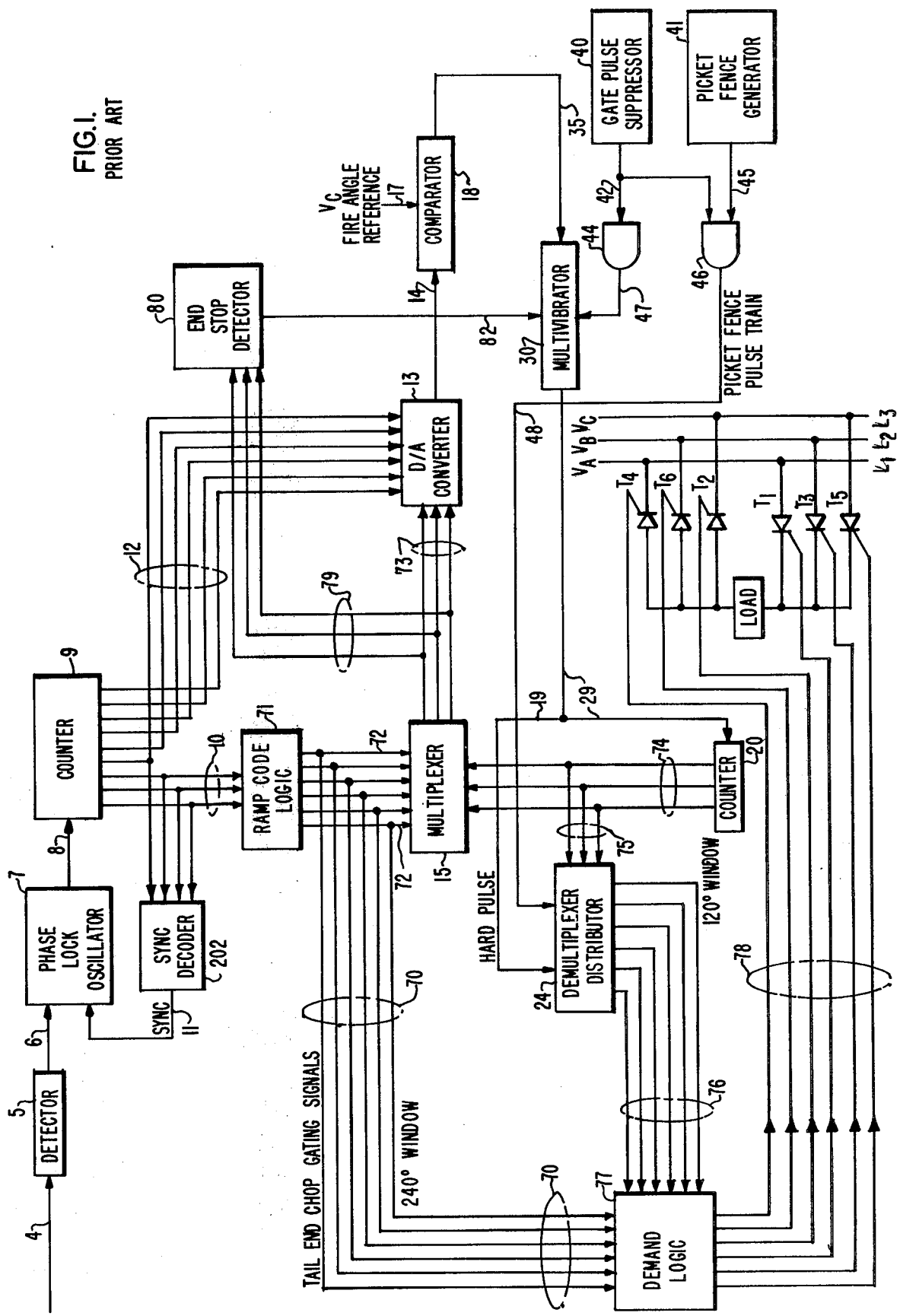
FIG. 1 is a schematic description of a digital pulse generator of the prior art, including end-stop detection and control, with gate pulse suppression and picket fence generation as described in U.S. Pat No. 4,028,609 of R. Detering.

FIG. 1, borrowed from U.S. Pat. No. 4,028,609 of R. L. Detering, shows six power thyristors $T_1$–$T_6$ mounted in a bridge with a load across a balanced three-phase system supplying voltages $V_A$, $V_B$, $V_C$ on three busses $L_1$, $L_2$, $L_3$ for phases A, B, and C. The thyristors are gated for conduction from separate lines 78. The firing circuit according to the present invention includes a zero-crossing detector 5 which is part of a phase-locked loop comprising a phase lock oscillator 7 and a sync decoder 202. Detector 5 is supplied on line 4 with a reference wave $V_{AB}$ from the three-phase power system. Each time the reference waveform passes by zero in one direction, the output of zero-crossing detector 5 exhibits a ZERO to ONE transition. It is generally known that a phase-locked loop can be used to phase-lock a local oscillator to a reference wave. It is also known that the local oscillator 7 can be made to operate at N times the frequency of the reference wave if the output of the local oscillator is first fed into a "divide by N" counter (counter 9 in FIG. 1). From the "divide by N" counter a feedback signal is obtained whose phase relationship is compared, after decoding by sync decoder 202, to the reference wave $V_{AB}$ after detection.

The sync decoder 202 generates feedback wave 11 which is compared to the zero-crossing detector output 6. The resulting phase locking causes a particular state of counter 9 to be made to coincide in time with the ZERO to ONE transition of the zero-crossing output 6. Consequently, each state of counter 9 represents a discrete time interval beginning at a particular point in time or phase angle, with respect to reference wave $V_{AB}$.

Figure 2:
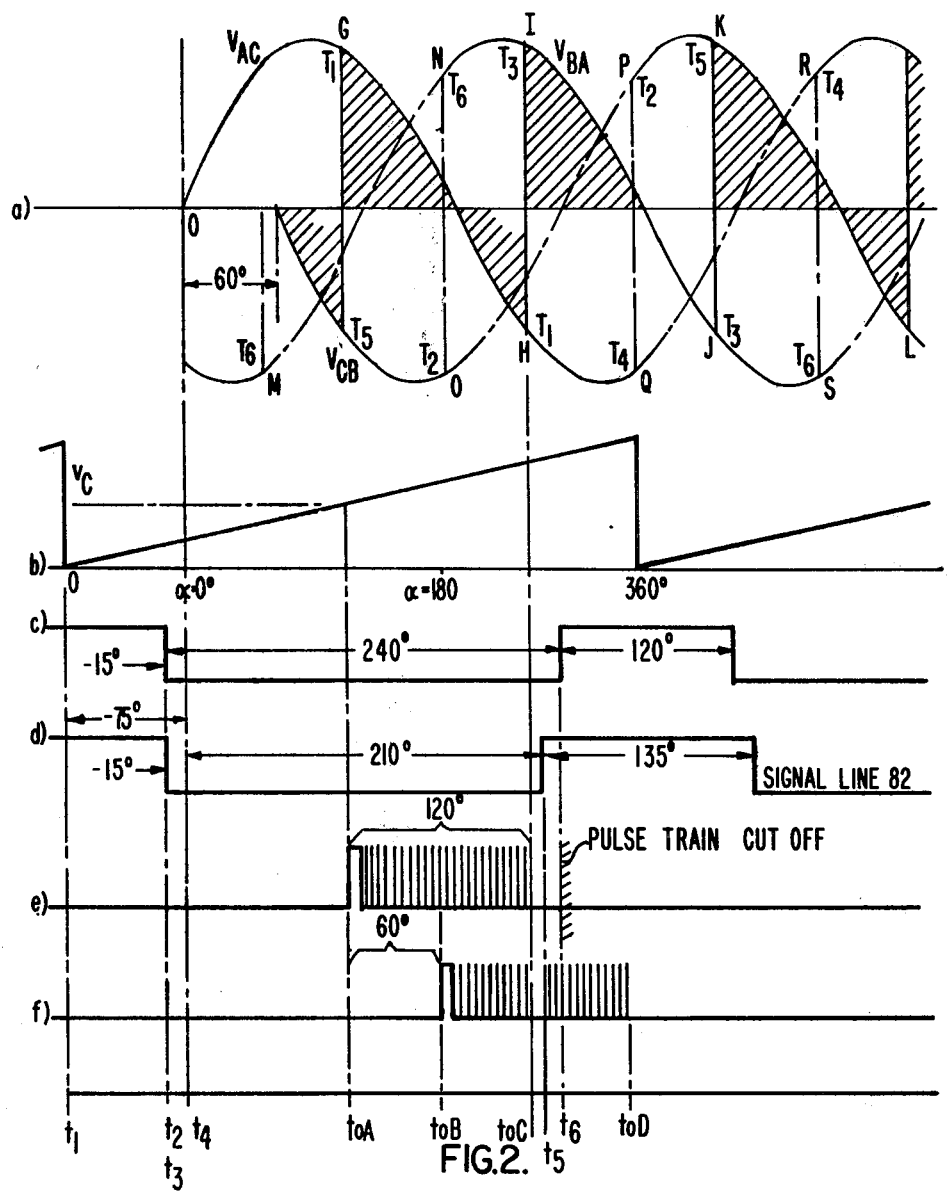
FIG. 2 is a series of curves explaining the firing process in accordance with the circuit of FIG. 1.

A digital to analog converter 13 responsive to such digital representation from counter 9 generates a ramp signal on line 14 (see curve (6) in FIG. 2) which is an analog representation of the electrical angle of the reference wave $V_{AB}$ on line 4. A comparator 18 responsive to the ramp signal of line 14 and to a reference voltage $V_C$ on line 17 generates at its output, on line 35, a critical signal which represents in time (to A in FIG. 2) the firing angle defined by the reference voltage $V_C$. Such critical signal on line 35 triggers a multivibrator 30 which in turn sets via line 29 a counter 20 into one of successive pre-established digital states. The latter, via line 75, controls the logic of a distributor demultiplexer circuit 24, which selects one of a plurality of thyristor channels among lines 76 and to which a control signal, on lines 29 and 19, is applied for thyristor gate control.

Since the object is to fire each of thyristors $T_1$-$T_6$ in sequence, counter 9 and D/A converter 13 are so controlled that on line 14 several ramps, shifted relative to each other, are generated in succession. Each ramp corresponds to a phase of the power supply for a given polarity. The phase shift is achieved by a multiplexer 15 having address lines 74 derived from counter 20 and logically set so as to select among lines 72 the "next"-ramp, e.g. one shifted relative to the preceding one by 60°. This ramp outputted on lines 73 is applied D/A converter 13 together with the bids of lesser significance received on lines 12 from counter 9 directly.

Referring to FIG. 2, curves (a) are the line voltage waveforms $V_{AC}$, $V_{CB}$ and $V_{BA}$ as applied to the thyristors $T_1$-$T_6$. They are shown with the periods of conduction indicated at firing angles $\alpha_1$—$\alpha_6$ for the respective thyristors. These curves are at a 60° phase shift to one another. Curve (b) shows one of the ramps generated by digital to analog converter 13 on line 14. The particular ramp is the one for thyristor $T_1$ which is fired at firing angle $\alpha_1$ for a voltage reference $v_C$ on line 17 at the input of comparator 18. In the commutation portion of the conduction cycle of thyristor $T_5$ at time $t_{oA}$ when thyristor $T_1$ fires, the voltage $V_{AC}$ applied between phases A and C causes natural commutation to occur turning OFF thyristor $T_5$. The same commutation process occurs at each firing angle $\alpha_2$-$\alpha_6$, in this order and alternatively for each polarity on the thyristor bridge.

The generation of a critical signal on line 35 depends upon the intersection of the horizontal line $v_c$ with the ramp. Should the voltage $v_C$ be smaller than the lowest point on the ramp or larger than the highest point on the ramp, comparator 18 will not generate a critical signal on line 35 to trigger multivibrator 30. Thus, no hard pulse will be generated. In order to insure the occurrence of a hard pulse at all times it is generally known to establish two end stops which define an operative range along the ramp. These end stops are generally obtained by imposing a minimum bias on the reference voltage $v_C$ and an upper limit thereto, so that, as seen by comparator 18, no excursion of $v_C$ outside these two limits is possible. The lower limit is generally known as the "rectification end stop", the other is the "inversion end stop". They are shown in FIG. 2 at $ES_1$ and $ES_2$ on the ramp and occur at times $t_3$ and $t_5$, respectively. Typically 210° is established between the two end-stops.

The ramp extends a 360° electrical angle and is shifted to the left of the associated line voltage waveforms, typically by 75° (from time $t_1$ to time $t_4$ on FIG. 2).

Special consideration should now be given to the hard pulses and picket fence pulses provided, namely by multivibrator 30 on lines 29 and 19 (hard pulse) and by picket fence generator 41 on line 48 (picket fence pulses) of FIG. 1.

It is known from "Thyristor Phase-Controlled Converters and Cycloconverters" by B. R. Pelly, published by John Wiley in 1971 (Chapter 10) to control the conduction period of a thyristor by applying a continuous extended pulse. Since the firing circuit of a thyristor generally includes a power circuit and a transformer for building and applying an effective gating pulse on the thyristor, an extended pulse is not easily handled by such firing circuit. In particular, the use of a transformer raises a problem of bandwidth. A transformer of narrow bandwidth is less costly, thus more desirable. Pelly also states that the front edge of the extended pulse is actually the effective portion for igniting a thyristor. Therefore it is suggested to use a pseudo-extended pulse containing of a discrete succession of narrow pulses, rather than a continuous pulse.

However, such pseudo-extended pulse is used in the prior art as a substitute for an extended pulse and as such, it is initiated and generated for the full conduction angle, like a continuous pulse. In contrast, as stated in U.S. Pat. No. 4,028,609 of R. Detering, the two functions of igniting a thyristor and of refreshing a thyristor already in conduction are more advantageously treated separately within a digital pulse generator, so as to optimize each function and reduce the overall cost of the system. To this effect, a "hard pulse" is generated for actually firing the thyristor and a "picket fence" pulse train is supplied to the thyristor behind the hard pulse. The "hard" pulse is a pulse having the minimum quality necessary for an efficient firing of the particular type of thyristor under control. For instance, the one-shot multivibrator 30 of FIG. 1 or 3 may be a solid state device sold in the open market as Model MC14528 of Motorola, Inc. Such device when triggered generates on line 29 a hard pulse in the form of a digital pulse. This pulse is passed via line 19 and demultiplexer distributor 24 onto the selected one of channels 76, and from there through demand logic gate 77 onto one of channels 78. With thyristors $T_1$-$T_6$ is associated a firing circuit (shown in FIG. 3 to include an amplification circuit 77', a pulse former circuit 701 and an isolation circuit 601, thereby to satisfactorily gate the thyristors). In this fashion on the gate electrode of the thyristor is applied, for each firing of the one-shot multivibrator 30, an effective "hard" pulse of proper quality in terms of duration and intensity. Typically, such hard pulse, according to the present invention is a 50 microsecond igniting pulse. Thus, the "hard" pulse is a pulse of higher level and power with a sufficiently long duration so as to insure the most efficient gating condition for the particular type of thyristor to be ignited.

In addition to the hard pulse, a train of "picket fence" pulses is generated by picket fence generator 41 via AND device 46 and line 48. The pulses consist in a series of equally spaced pulses of shorter duration for the purpose of refreshing the conduction of the thyristor which has just been ignited. Frequently, depending upon the conditions of application, a thyristor may receive a reversed biasing voltage which could turn it back from the ON to the OFF state. The oncoming picket fence pulse will turn it ON again. More generally the picket fence pulses assure a reliable period of conduction after ignition by a hard pulse. Typically a picket fence pulse lasts 20 microseconds in the case of the preferred embodiment of the invention. Such a picket fence pulse would not be sufficient to safely ignite a thyristor but is sufficient to maintain the thyristor in the ON condition. It is observed that the picket fence pulses supplied in the digital pulse generator according to the invention are not synchronized with the line frequency, or with the gating angle releasing a hard pulse. The master oscillator is freely running. Therefore, actually the picket fence pulses are not gated in time. They are simply allowed to pass into a channel together with the hard pulse from the time the latter is being applied.

The generation of a hard pulse and of picket fence pulses has been shown in the aforementioned Detering patent. Also shown in the Detering patent is the provision for pulse suppression upon an emergency. Normally, the operation of a firing pulse generator is terminated in two steps. The firing angle of the thyristor is phased back to the point of zero power and thereafter either the power to the thyristor is cut off, or the load is switched off. Instead of such a controlled shut-down, there are situations requiring an immediate interruption of operation. For instance the emergency may be an overcurrent in the system due to a short circuit, or the thyristors fail to commutate properly. The equipment, the load or the thyristors could be damaged if the converter operation would be allowed to proceed. Therefore, sensing devices (not shown) are provided such as electronic limit switches, current transformer and an electronic detector or comparator device which are able to actuate a pulse suppressor (GPS) such as shown at 40 in FIG. 1. When suppressor 40 is actuated in response to such emergency situation, an inhibit signal 42 is generated at the output on line 42. A NAND gate 44 passes such inhibit signal on line 47 to a control electrode of multivibrator 30 so as to prevent triggering from line 35. In this fashion no hard pulse can be applied onto counter 20 whenever an inhibit signal is present on line 47. This particular feature also preserves the integrity of a hard pulse which has already been initiated by the multivibrator, since the latter will remain in its second state for the full 50 μs duration. As a matter of fact, the hard pulse is an optimized hard pulse specially developed for application to the thyristor, and it is not desired to apply less than such full hard pulse in order to avoid damaging the thyristors by an incomplete ignition.

While the picket fence pulses are being generated from a free running picket fence generator 41 and passed via line 45 and NAND gate 46 on line 48 to the demultiplexer distributor 24, the pulse suppressor 40, when actuated, applies an inhibit signal on lines 42' to block NAND gate 46 so that the pulses are no longer passed to the thyristors $T_1$-$T_6$.

FIG. 1 shows that the picket fence pulses issued from generator 41 do not partake of the triggering actions of the hard pulses on line 29 which advance counter 20. The picket fence pulses are passed on line 48 in parallel to the hard pulse appearing on line 19 to the demultiplexer distributor 24. The logic of the distributor is such that one of channels 76 becomes available to receive the hard pulse from line 19 at the moment counter 20 transfers to a subsequent state. This logic is defined by lines 74, 75 from counter 20. The selected channel remains available during the conduction angle which, in this particular instance, has been chosen to be of 120°. Therefore, the picket fence pulses are admitted on the selected channel from line 48 together with the hard pulse from line 19. They, however, extend for the entire conduction period, as shown in FIG. 2.

Some precautions are necessary in order that the pseudo-extended pulse created by the combination of hard pulse and picket fence pulses does not extend too far into the region for which the thyristor becomes reverse biased, as the case would be if the firing angle were shifted back too much. If this happened, the thyristor could exhibit current dissipation due to internal leakage and the thyristor could be damaged. Also, the thyristor bridge could fail to properly operate. In order to prevent this, it is known to cut off the extended pulse at the point a reverse bias condition would occur. By sensing the commutating voltage on the thyristor it has been possible in the past to generate a control signal causing an immediate cut-off to the conduction at this point. In the Detering patent, the particular technique used consists in establishing a window beyond which the picket fence pulses are not allowed to pass to the thyristor firing circuit. This function is performed by the demand logic circuit 77 inserted after demultiplexer 24 between channels 76 and 78. The idea is to generate digital information representing the instantaneous electrical angle in relation to the particular phase being synthesized and to compare such instantaneous information with a digital number representing the cut-off point known from the firing angle for a given conduction angle. From such comparison a critical signal is derived and applied to circuit 77. In this manner, it is possible to generate an inhibit signal to prevent the picket fence pulses from passing through circuit 77 at the exact time $t_6$ shown in FIG. 2. Lines 73 at the output of multiplexer 15 would provide the required digital information since the three most significant digits $Q_7$, $Q_8$, $Q_9$ characterized the particular ramp and phase line as selected by counter 20 after transfer. A counter would provide the digital reference for establishing a count at time $t_6$ corresponding to the cut-off point. As shown in FIG. 2, taking advantage of the simplification due to the fact that all phases are 60° apart and the desired cut-off point can be conveniently and practically chosen to be on one side of a window of 240°, it is possible to use the reference timing waveform tied to line voltage $V_{AB}$ for all the thyristors. A division of such time reference into six different time intervals and a proper distribution of these time intervals between the respective phases, or channels, makes it possible to establish the cut-off points for the various thyristors. To this effect, a ramp decode logic circuit 71 is provided for generating from counter 9 a decoded representation of the three most significant digits $Q_7$, $Q_8$, $Q_9$ thereof. Thus, six wires 70 are derived from the ramp code logic circuit 71 as logic wires to demand logic circuit 77 which establish for each channel 76 alternate ON and OFF states such as those shown by curve (c) of FIG. 2. Actually the front edge of curve (c) is not used since endstop $ES_1$ (at time $t_2$ and $-15°$) would not allow the firing angle to decrease beyond $-15°$, or time $t_2$. In general $t_3$ must always be greater or equal to $t_2$. However, should the firing angle be shifted back toward end-stop $ES_2$, a moment will arrive when the picket fence pulses, which are separately fed, will become cut-off more and more (as can be seen from a comparison of curves (e) and (f) of FIG. 2). Time $t_6$, at 225° is the cut-off point in this particular instance.

End-stops $ES_1$ and $ES_2$ of FIG. 2, are generally established by generating on line 17 (FIG. 1) limits such that $v_C$ actually never appears outside these two limits. It is understood that, as shown in the aforementioned Johnson patent, reference signal $v_C$ need not be in analog form. An all digital comparator is not excluded. If the reference signal, $v_C$, in FIG. 1 were allowed, as seen from the comparator 18, to decrease to such extent that, at the beginning, or the top, of the time dependent reference, e.g. the ramp of FIG. 2, a comparison could no longer be made by comparator 18, and no critical signal would be generated on line 35, thus, no hard pulse would be applied on line 29 to advance counter 20. In order to prevent this and insure the ignition of the thyristor "next" in sequence, a hard pulse is caused to appear by controlling multivibrator 30 directly. As shown in FIG. 1, digital information is derived from lines 73 at the output of multiplexer 15 and applied via lines 79 to a decoder serving as end-stop detector circuit 80. The latter circuit is a digital decoder which detects the desired end-stops $ES_1$, $ES_2$ in the form of a transition to a digital state. Normally detector 80 detects these two limits and assumes opposite states at the output 82 for counts within and outside these limits. The signal on line 82 is applied as a triggering signal to multivibrator 30. As a result of the end-stops a hard pulse is generated on line 29 due to triggering via line 82 and normal operation will result as if a firing angle had been established at this time.

It is observed that while two kinds of pulses are generated and applied to the firing control circuits of the thyristors, gate pulse suppression operates on both types of pulses while the picket fence generator remains free-running and the hard pulse remains unaffected if the multivibrator has already been triggered. These two features are necessary for important considerations.

First, it is convenient to have a free-running oscillator for the generation of the picket fence pulses. Since the hard pulse is initiated each time one particular thyristor is to be turned on (for instance, at the time $t_{oB}$ when the oncoming thyristor $T_2$ is fired and the outgoing thyristor $T_1$ goes out of conduction, as shown in FIG. 2) thus, at the instant when counter 20 assumes its "next" state, all that is needed is to supply the available picket fence train to the appropriate channel concomitantly and after such transfer. In this instance, it is also necessary to have the picket fence supplied to two channels in parallel since two thyristors are conducting at the same time (for instance at $t_{oC}$ when thyristor $T_2$ is fired following firing of thyristor $T_1$). The independence of generator 41 makes the picket fence train available at all times without any particular triggering circuitry.

Secondly, once a hard pulse appears on line 19 the firing control circuit associated with the selected thyristor initiates the ignition process which will be safely completed at the end of the 50 $\mu s$ period, since the hard pulse has been specifically designed for this purpose. It is important not to interrupt a hard pulse once it has been applied. Once initiated, the ignition process must proceed for the entire duration of the hard pulse.

DESCRIPTION OF THE PREFERRED EMBODIMENT

For the purpose of simplicity in describing the preferred embodiment in full detail, the descriptions of U.S. Pat. No. 4,017,744 of Frederick O. Johnson entitled "Digital Firing Pulse Generator For Thyristor Power Converters" dated Apr. 12, 1977 and of Richard L. Detering entitled "Digital Firing Pulse Generator With Pulse Suppression" dated June 7, 1977 are hereby incorporated by reference.

Figure 3:
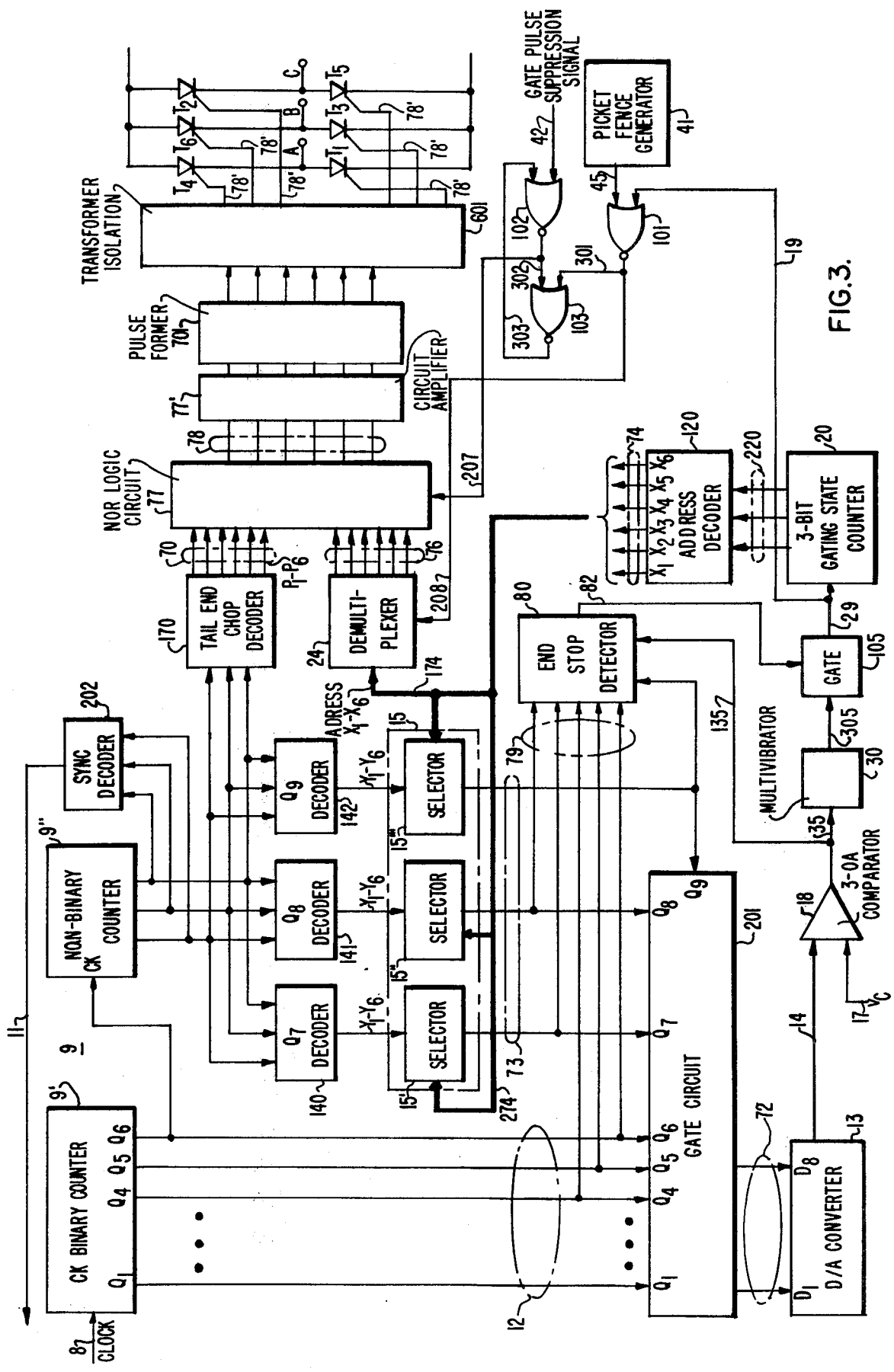
FIG. 3 shows the overall organization of the digital pulse generator according to the invention.

Referring to FIG. 3, the digital pulse generator according to the present invention, its organization borrows features from the systems shown in FIG. 1 of the Detering patent and in FIGS. 1 and 9 of the Johnson patent, as will be explained hereinafter. The novel features will appear against such background in the course of the description hereinbelow.

In contrast to Johnson, Detering does not use the ring-counter 20 for gating the next thyristor. Rather, once the comparator 18 has changed state, a hard pulse generator 30 is triggered. The ring counter in Johnson provides for the selection of the next timing wave from ramp generator via the multiplexer 15. These two features are used in the preferred embodiment as shown by FIG. 3. Also, as shown in FIG. 9 of Johnson, the digital counter 9 of FIG. 1 therein comprises a multistage counter providing the least significant digits for the generation of a time dependent reference, e.g. ramp. Also, a 3-stage counter provides, after selection in accordance with the last ring-counter state and with proper decoding, the most significant digits which select the proper timing wave, or ramp.

In FIG. 3 elements already shown in FIG. 1 are identified by like reference numerals.

Counter 9 is comprised of a binary counter 9′ having six bits $Q_1$–$Q_6$ (outputted on line 12), and a six-state counter 9″, typically a Johnson counter. Counter 9′ is actuated by the clock signal (384×60 Hz frequency) on line 9 from the voltage controlled oscillator of the phase locked circuit 7 (FIG. 1). Counter 9″ is triggered into its successive states at the ZERO to ONE transition of $Q_6$. The outputs 110 from counter 9″ are decoded by a tail end chop decoder 170 in order to provide on line 70 the permissible firing range of the six thyristors $T_1$–$T_6$. The outputs 110 are decoded by three decoders 140, 141, and 142 providing six possible combinations $Y_1$–$Y_6$, respectively, for $Q_7$, $Q_8$ and $Q_9$. These are fed into the multiplexer 15 which, in a fashion already described in the Johnson patent, is controlled by the ring counter 20 (FIG. 1). As a result, $Q_1$–$Q_9$ provide from counters 9′ and 9″ at any given time one of six full time dependent references, e.g. ramps, namely, the one which in the sequence, corresponds to the "next" thyristor to be ignited. The ring-counter 20 is a six-state counter, like counter 9″ also a Johnson counter. The outputted state is characterized by three output lines 220 fed into an address decoder (120), which has six output lines 74 defining six addresses $X_1$–$X_6$ used, via lines 274 onto demultiplexer 15, to select the proper ramp. These addresses are also used via lines 174 to control a demultiplexer 24 which, like in the Detering patent, via lines 76 identifies the correct firing channel, e.g. for the "next" thyristor. As generally known, the gate pulse generator supplies logic pulses which are treated by an amplifier circuit, a pulse former and such a pulse is applied to the proper thyristor ($T_1$–$T_6$) through an isolation transformer.

In contrast to FIG. 1, and as shown in FIG. 3 the synthesized time dependent reference is modified by a gate circuit 201 (shown in FIG. 5) which, as explained hereinafter, limits the informational range to substantially the permissible firing angle range usually defined by the advance (or rectification) end-stop and the retard (or inversion) end-stop. Limiting the timing wave to its useful range makes it possible to reduce the number of bits required from the D/A converter 13. As shown in FIG. 3, an eight-bit circuit is used in the preferred embodiment. After conversion, an analog representation of the ramp appears on line 14 which comparator 18 (operational amplifier 3-OA) compares with a reference signal $v_C$ applied on line 17, thereby to generate at the output 35 a transition in the output state which determines the firing angle desired for the "next" thyristor.

Comparator 18, when changing state at the critical instant on the ramp, triggers via line 35 a monostable multivibrator 30 (typically an MC14528 solid state device) which, as in the Detering patent, normally actuates the ring-counter 20 via line 29 and by line 19 transmits a hard pulse to ignite the "next" thyristor. However, in contrast to the Detering patent, the outputted hard pulse (actually on line 305 of FIG. 3 from the output of multivibrator 30) is only allowed onto lines 29 and 19 after it has passed a gate circuit 105. Here, multivibrator 30 is no longer under the effect of an Exclusive-OR control by an end-stop detector circuit 80 for a range defined by the advance ($ES_1$) and retarded ($ES_2$) end-stops which delineate the permissible firing angle range. Instead, the end-stop detector circuit 80 of FIG. 3 operates through a gate circuit 105 present at the output of the hard pulse generator or multivibrator 30. An inhibiting or a gating control signal is applied via line 82 by the end-stop detector 80. Moreover, the end-stop detector 80 generates its own hard pulse used as a substitute for the one blocked by gate 105, or not generated timely by the hard pulse generator 30. Also in contrast to the Detering patent, gate pulse suppression is no longer applied directly to the multivibrator in order to inhibit the generation of a hard pulse. Rather, a combination of NAND gates 101, 102 and 103, shown in FIG. 3, establishes on line 207 a permissible logic state decoded from the supplied hard pulse on line 19 onto line 208 at the input channels and from the gate pulse suppression signal applied on line 42. Rather than inhibiting the generation of a hard pulse by the multivibrator, it is the demand logic circuit in the form of a NOR logic 77 which is inhibited by the logic signal on line 207, whenever it is in the non-permissive logic state. The operation of the gate pulse suppression circuit is as follows:

Either a hard pulse on line 29, or a picket fence on line 45, is at any given time present at the input of NAND gate 101, thereby normally to pass through 208 an igniting control signal onto the NOR logic circuit 77, via lines 76, as selected by demultiplexer 24 in accordance with the address $X_1$–$X_6$ derived from ring-counter 20. If, however, a gate pulse suppression signal is present on line 42, as input to NAND gate 102, normally, gate 102 will via line 207 inhibit NOR logic circuit 77 of the gate pulse generator. Nevertheless, should there be a hard pulse already initiated when gate pulse suppression occurs, the concurrence of the output signal on line 301 from gate 101 and of the output signal on line 302 from gate 102 will establish by line 303 from gate 103 a blocking condition on gate 102. Therefore no inhibition will be commanded by line 207 from NAND gate 102.

The gate pulse suppression function and the end-stop detector function being both performed independently from the operation of the multivibrator, it becomes possible to perform them entirely by solid state techniques and to place them together as an LSI chip. This is clearly apparent from FIG. 4 which shows at 200 an LSI chip embodying many of the functions just described.

Figure 4:
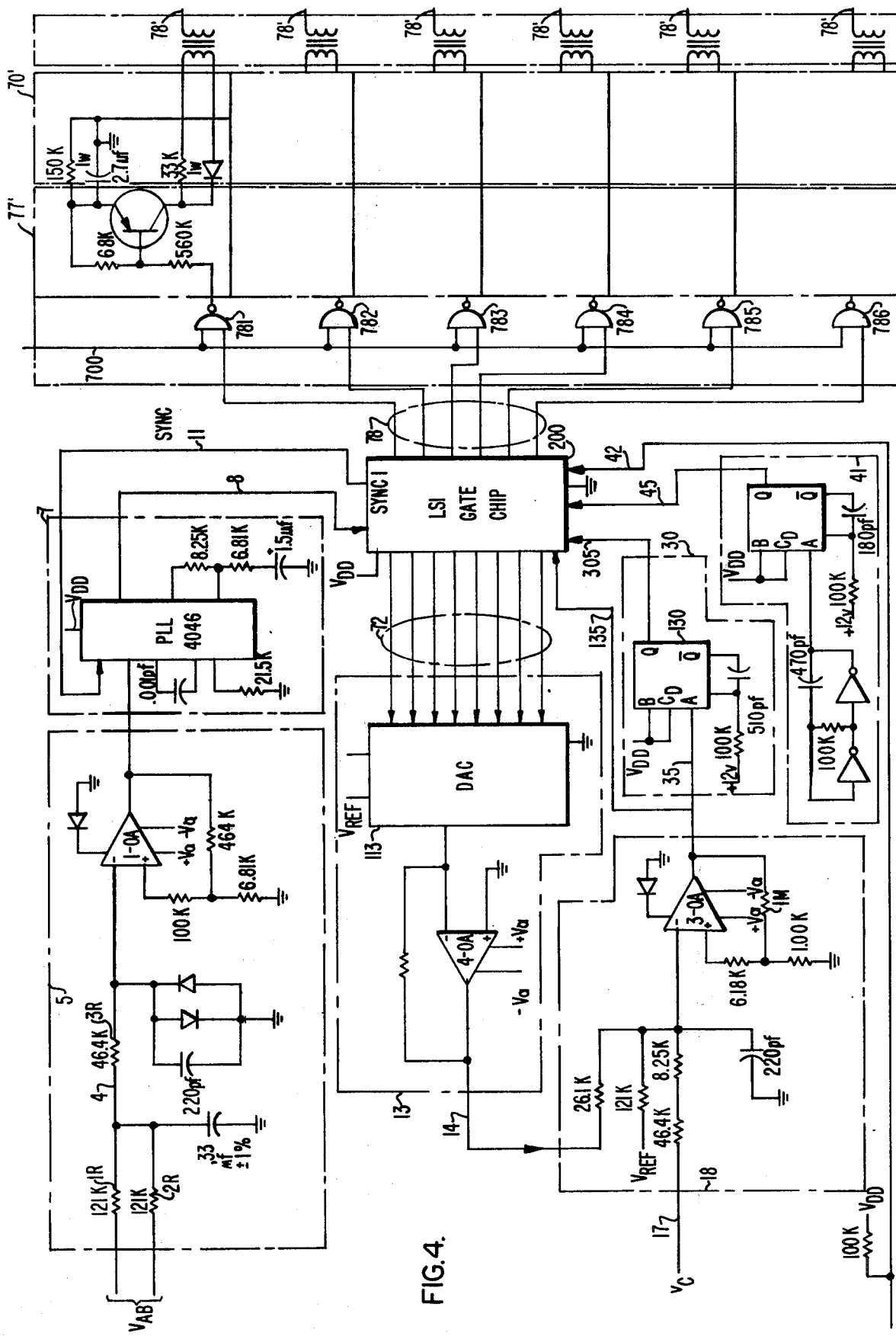
FIG. 4 identifies the LSI module according to the invention, connected in the circuit of FIG. 3.
Figure 5A:
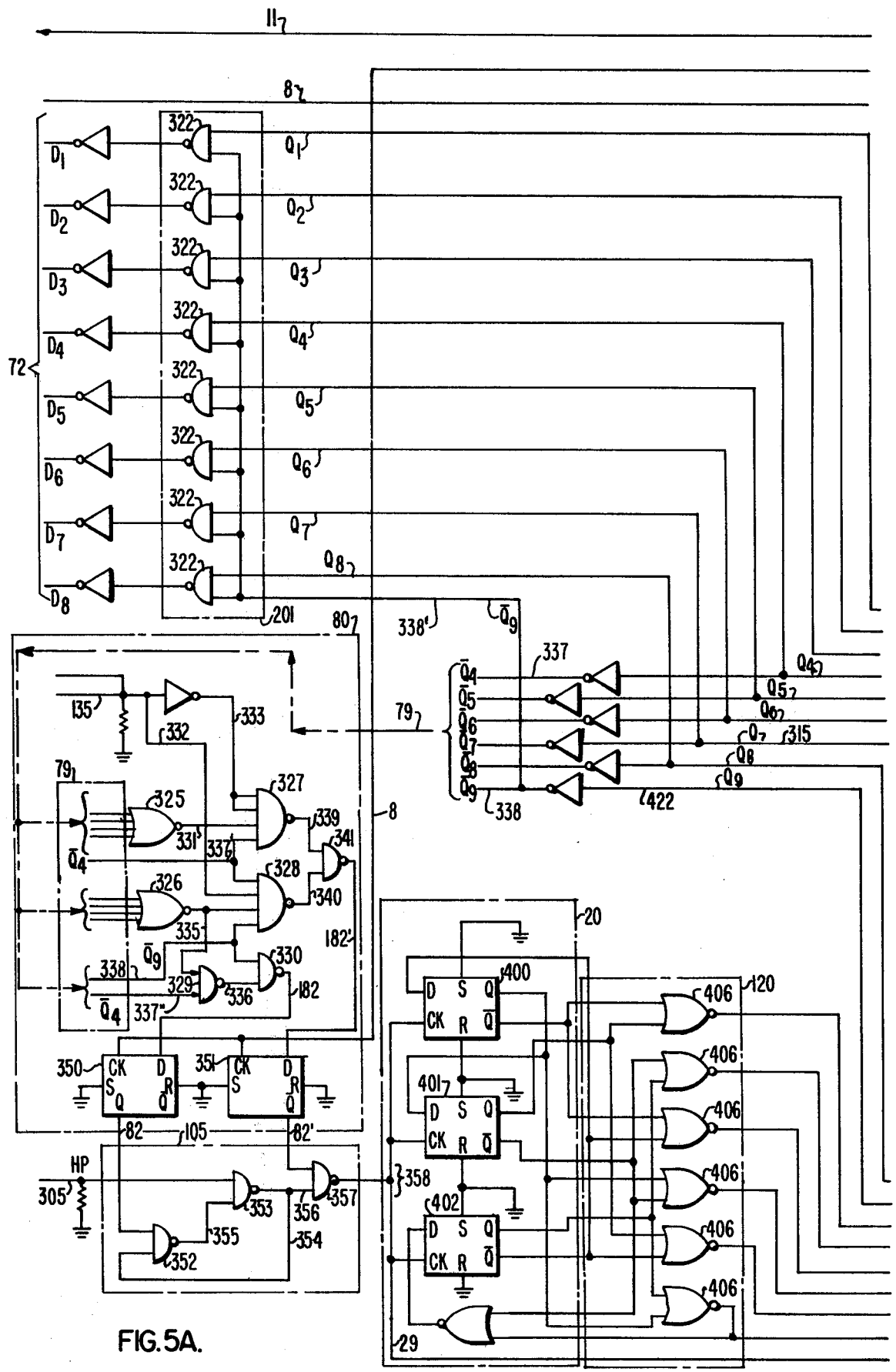
FIGS. 5A, 5B and 5C show in detail the solid state circuitry of the circuit of FIG. 3 which is included in the LSI chip of FIG. 4.
Figure 5B:
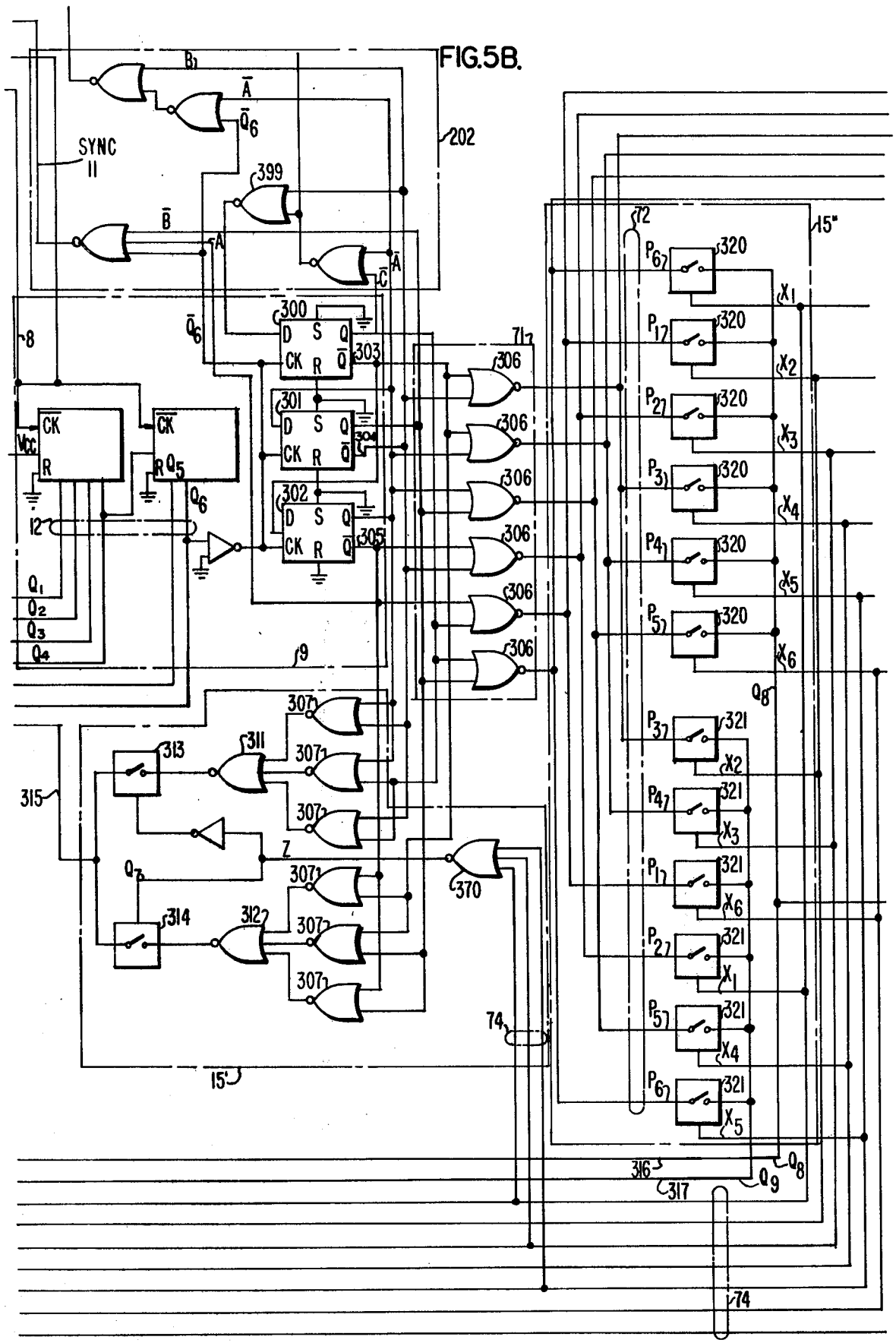
Figure 5C:
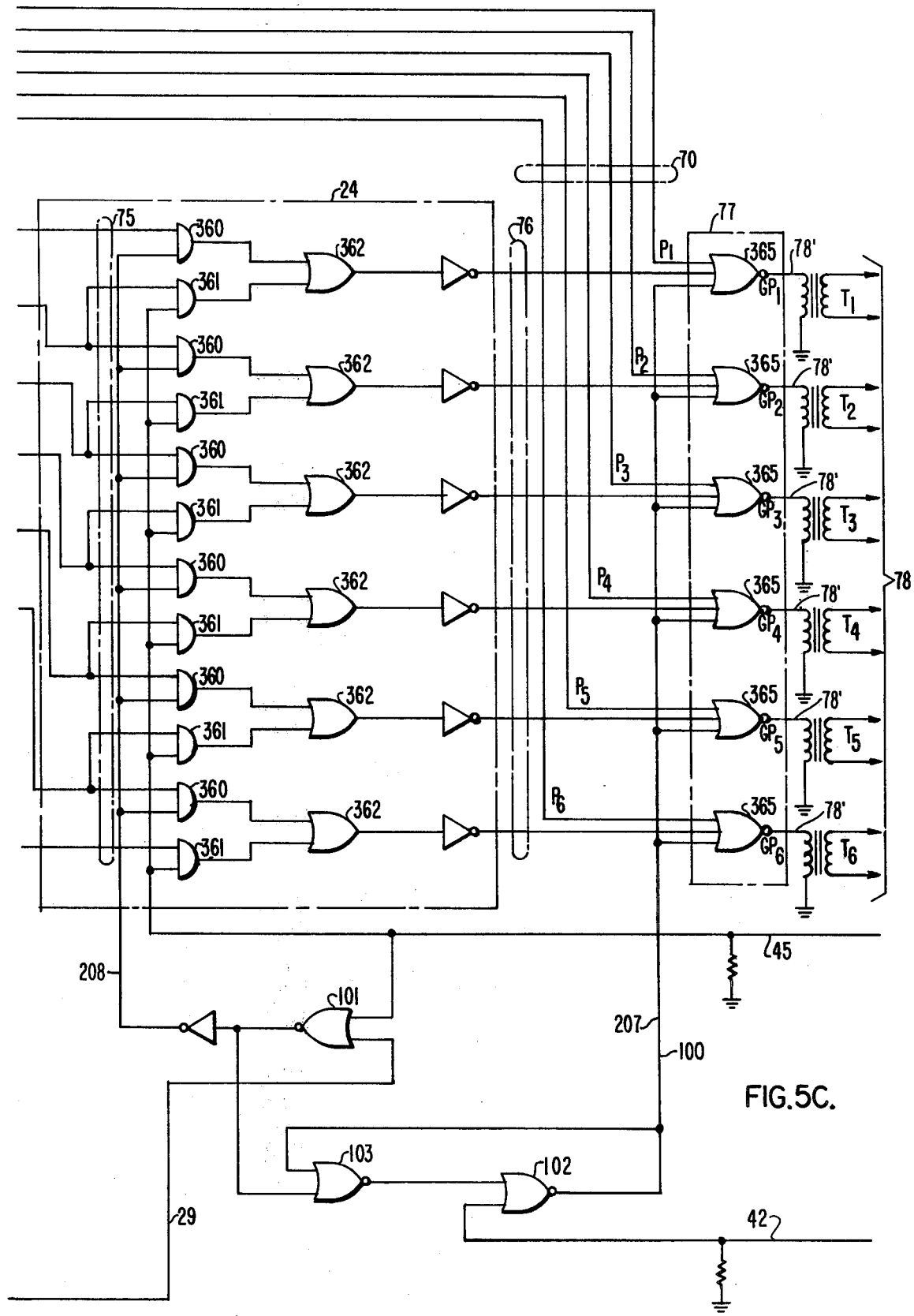

FIGS. 5A, 5B and 5C show in detail the organization of the LSI circuit according to the present invention. In addition to FIG. 3, FIG. 4 shows disposed externally of the LSI chip the zero-crossing detector 5 responsive to $V_{AB}$ (voltage between phase A and phase B), which detector includes a 75° phase shift defined by resistor network 1R, 2R and 3R, and an operational amplifier 1-OA as generally known. The output is applied to the phase detector portion of the phase-locked oscillator 7 which is a solid state device 4046. FIG. 6 shows the signals applied on pin 14 from the operational amplifier 1-OA, on pin 4 which outputs on line 8 the clock signal, and on pin 3 e.g. the synchronizing signal sync of line 11.

FIG. 4 also shows the comparator 18 responsive to the reference signal $v_C$ on line 17 and to the ramp supplied on line 14 by operational amplifier 4-OA which is coupled to the output of a digital-to-analog converter 13 consisting in an 8-bit D/A converter 113.

Operational amplifier 3-OA is shown connected as a comparator, and its output is applied to multivibrator 30. The latter is an MC14528 solid state device 130 having the appropriate time constant (100K resistor and 510 pf capacitor). The output 305 is fed into the LSI chip 200. The picket fence generator 41 appears as a solid state device type MC14528 which is clocked by a free-running oscillator. The output on line 45 is fed into the LSI chip 200. A gate pulse suppression signal received on line 42 is also applied to the LSI chip.

The LSI circuit, thus, receives as inputs: the clock signal on line 8, the hard pulse from the multivibrator on line 305, the picket fence pulses on line 45, and the gate pulse suppression signal on line 42. In addition, the logic of the output of operational amplifier 3-OA is inputted via line 135 into the LSI circuit. Lines 72 from circuit 200 provide the eight digits for into the 8-bit DAC 113. The sync signal on line 11 is also derived from circuit 200. NOR logic circuit 77, contained within circuit 200, is outputting on lines 78 the firing pulses to NOR gates 781–786. Circuit 701 is shown on FIG. 4 as a pulse-forming transistor arrangement. The thyristor gating pulses $GP_1$ to $GP_6$ are applied from there to an isolation transformer 601 preceding the control electrodes of thyristors $T_1$–$T_6$.

Referring to FIGS. 5A, 5B and 5C, the internal organization of circuit 200 will be now considered in detail. The operation of this circuit will also be explained by reference to the curves of FIG. 6A and 6B.

Counter 9' (consisting of two solid state units known together as type 4520, clocked by line 8) appears in circuit 9 of FIG. 5B with its bits $Q_1$–$Q_6$ applied via lines 12 to corresponding NAND gates of circuit 201 (FIG. 5A). Counter 9" also within circuit 9 of FIG. 5B, is a Johnson-counter having states A, B, C as shown in the $\overline{Q}$ pins (lines 303–305) of the three solid state devices 300–302 (type 4013). Counter 9" is triggered (clock pin) by ZERO to ONE transition, of $Q_6$ from counter 9'.

States A, $\overline{B}$ and $\overline{Q}_6$ are decoded by circuit 202 (FIG. 5B including NOR gate 399, to form SYNC signal of line 11. NOR devices 306 of circuit 71 (FIG. 5B) decode states CB (for $P_3$), $\overline{CA}$ (for $P_4$), $\overline{AB}$ (for $P_5$), AB (for $P_2$) $\overline{AC}$ (for $P_1$) and $\overline{CB}$ (for $P_6$), where $P_1$–$P_6$ are the sequence of channels for the respective thyristors $T_1$–$T_6$. These appear on lines 70 to NOR gates 365 of circuit 77 outputting gate pulses $GP_1$–$GP_6$ via isolation transformer 701 on respective lines 78'.

Switches 320 for multiplexer 15" and $Q_8$, and switches 321 for multiplexer 15''' and $Q_9$, provide the respective $P_1$–$P_6$ on lines 310 from circuit 71 (FIG. 5B). These switches are controlled by addresses $X_1$–$X_6$ on line 74 from demultiplexer address decoder 120 (FIG. 5A). The relation is as shown: $X_1$ for $P_6$ in 15' and $P_2$ in 15"; $X_2$ for $P_1$ and $P_3$; $X_3$ for $P_2$, $P_4$; $X_4$ for $P_3$, $P_5$; $X_5$ for $P_4$, $P_6$ and $X_6$ for $P_5$, $P_1$. Thus, multiplexer 15" provides $Q_8$ on line 316 and multiplexer 15' provides $Q_9$ on line 317. Taking advantage of certain symmetries, addresses $X_1$, $X_3$ and $X_5$, via NOR gate 370, control the outputted logic Z which for one logical state controls switch 314 and for the complement control switch 313. By proper decoding (FIG. 5B) of the states of counter 9" with NOR gates 307 and NOR gates 311, 312 (one for the direct and the other for the complement) $Q_7$ is obtained on line 315. Circuit 201 (FIG. 5A) consists of NAND gates 322 all controlled by $\overline{Q}_9$ from line 422. The second inputs of NAND gate 322 are respectively $Q_1$–$Q_8$. Therefore, whenever the logic $\overline{Q}_9$ is present on line 338', none of $Q_1$ through $Q_8$ will be outputted at the output of circuit 201. As a result and as explained hereinafter by reference to FIGS. 6A, 6B, the form of the synthesized ramp outputted by D/A converter 13 will be such that the ramp of time wave slightly exceeds at both ends the permissible range defined by the lower limit (first end-stop) to the upper limit (second end-stop). By so limiting the useful range it is possible to use only eight bits for D/A converter 13.

Figure 6A:
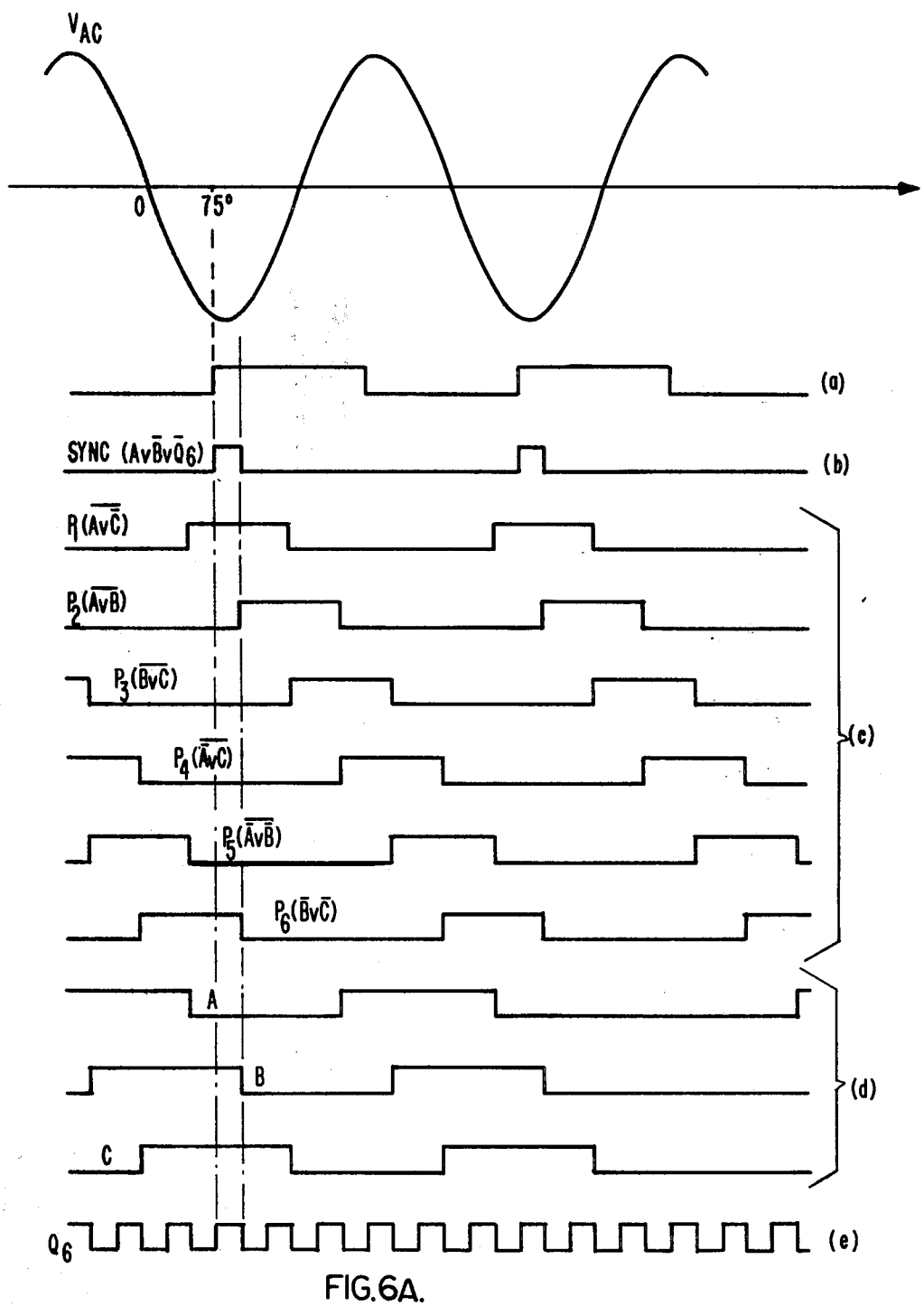
FIGS. 6A, 6B are curves illustrating the operation of the digital pulse generator of FIGS. 3 to 5C.
Figure 6B:
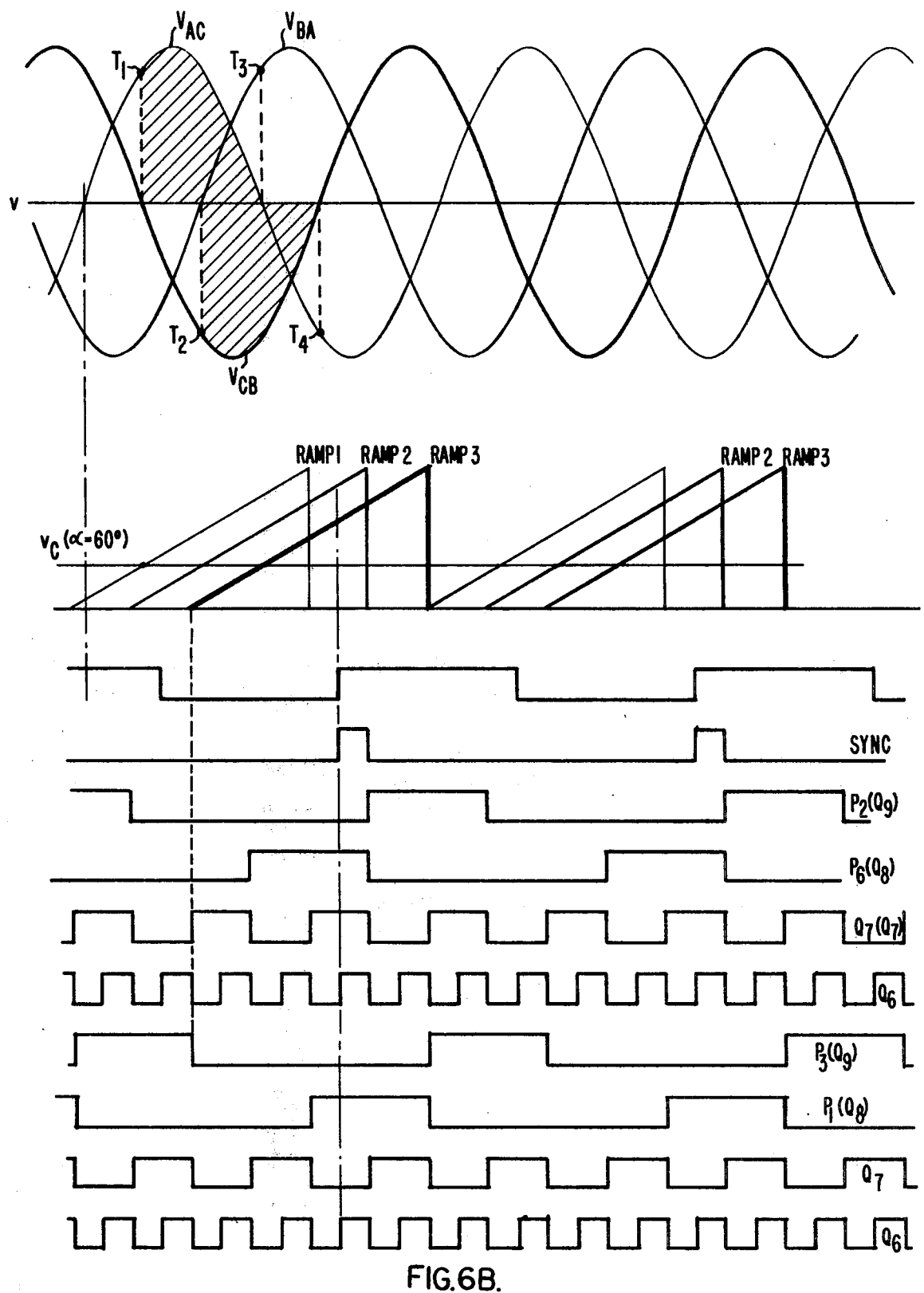

Reference will be had now to FIGS. 6A–6B in order to describe the synthesization and proper phase shifting of the ramps for the selection of a ramp matching the particular state of ring-counter 20 for the "next" thyristor to be fired.

FIG. 6A represents the reference wave $V_{AB}$ used as a reference for the zero-crossing detector 5 of FIG. 4. Curve (a) is the signal inputted at pin 14 of the phase-locked loop device in circuit 7 from operational amplifier 1-OA, e.g., after effecting a 75° phase shift. Curve (c) is the SYNC signal received on line 11 and aligned by one edge with the signal of curve (a) due to the phase-locking action. Curves (d) are the A, B, C states of counter 9" triggered by $Q_6$ (curve (e)) from counter 9', itself triggered by the clock signal of line 8. $P_1$ present on one of lines 310 is obtained as one of curves (c) by decoding of $\overline{(A \vee C)}$ from the Johnson-counter. Similarly, $P_2 = \overline{(A \vee B)}$; $P_3 = (\overline{B} \vee \overline{C})$; $P_4 = (A \vee \overline{C})$; $P_5 = \overline{(A \vee B)}$ and $P_6 = (B \vee \overline{C})$.

Referring to FIG. 6B, the successive phases $V_{AB}$, $V_{CB}$, and $V_{AC}$ are shown in relation to the six ramps 1–6 which are digitally generated at the input of D/A converter 13. As explained earlier, by the operation of circuit 201, $\overline{Q}_9$ quenches out all the bits normally compounded to form the ramp. As a result, in the example shown each ramp is formed for only $\frac{2}{3}$ of the cycle, followed by a flat portion extending for $\frac{1}{3}$ of the cycle due to $\overline{Q}_9$ controlling circuit 201. The six ramps shifted by 60° are shown as curves (f). Multiplexer 15 provides the following correlation:

Ramp 2 is formed by $P_2 = Q_9$; $P_6 = Q_8$; $Q_7$, and all the other digits from lines 12 which are in binary relation to each other namely $Q_6$–$Q_1$. Curves (g), (h), (i) show the time relation of $P_2$, $P_6$, $\overline{Q}_7$ and $Q_6$, which curves add up to form ramp 2, while $\overline{Q}_9$ establishes the flat portion between ramps.

Similarly, as shown by FIG. 6B, ramp 3 is obtained with $P_3 = Q_9$, $P_1 = Q_8$, $Q_7$, and $Q_6$–$Q_1$.

Figure 7:
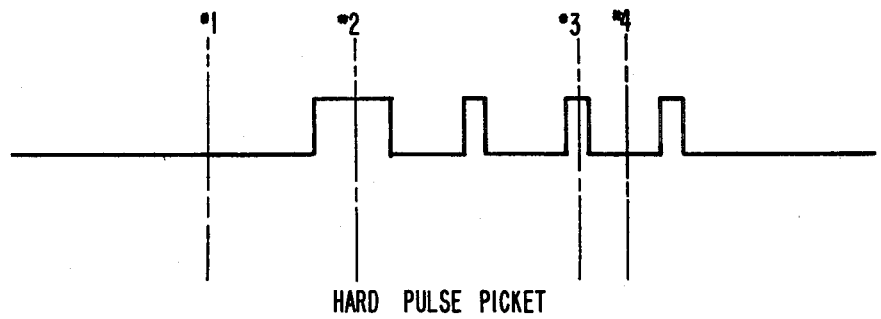
FIG. 7 shows critical events guarded against by the gate pulse suppression circuit mounted in the LSI chip of FIG. 5.

Referring to FIGS. 5A, 5B, 5C and FIG. 7, the LSI circuit 200 will now be considered from the end-stop control aspect. As shown in FIG. 7, each ramp extends for 256 states, from a total of 384 states covering the 360° electrical angle range defined by the phase-locked loop circuit 7 (FIG. 4) and the clock signal 8 (FIGS. 4 and 6A). Thus, 128 states of counter 9 define each high state of $P_1$–$P_6$ (curves (c) of FIG. 6A), as well as for $Q_9$ (FIG. 6B), while 256 states correspond to the opposite state.

The zero count or zero of the ramp cycle is defined by $Q_6$ and corresponds to $-15°$ on the electrical angle scale of the phase line (FIG. 6A), e.g., 15° before the zero-crossing point.

Count 256 corresponds to 225°, at the top of the ramp. For all practical purposes, this range is the useful one for the permissible firing angle range. The end-stops are defined to be within such range and close to each of these extreme points. The lower limit end-stop ($ES_1$) is chosen to be at state 8 of the ramp, e.g., to correspond to $\alpha = 7.5°$. The upper limit end-stop ($ES_2$) is chosen to be at state 248 on the ramp, e.g. 217.5°. The table of truth for these two states is as follows:

| State 8 ($\alpha = -7.5°$) | State 248 ($\alpha = 217.5°$) |
| --- | --- |
| $Q_9 = 0$ | $Q_9 = 0$ |
| $Q_8 = 0$ | $Q_8 = 1$ |
| $Q_7 = 0$ | $Q_7 = 1$ |
| $Q_6 = 0$ | $Q_6 = 1$ |
| $Q_5 = 0$ | $Q_5 = 1$ |
| $Q_4 = 1$ | $Q_4 = 0$ |
| $Q_3 = 0$ | $Q_3 = 0$ |
| $Q_2 = 0$ | $Q_2 = 0$ |
| $Q_1 = 0$ | $Q_1 = 0$ |

As shown in FIG. 5A, end-stop detector 80 performs decoding of ($Q_4$–$Q_8$) and ($\overline{Q}_4$–$\overline{Q}_8$) from lines 79 by NOR devices 325 (inputs $\overline{Q}_5$–$\overline{Q}_8$) and 326 inputs $Q_5$–$Q_8$). NAND gate 329 receives input lines 337" for $Q_4$ and input line 335 from NOR gate 326, while the outputs of devices 325, 326 are inputted into NAND gates 327, 328, respectively. $\overline{Q}_4$ is also inputted into each of NAND gates 327, 328. The outputs of NAND gates 327, 328 in turn are both inputted into NAND gate 341. The logic signal $\overline{Q}_9$ is inputted, together with the output of NAND gate 329 (by line 336) into a NAND gate 330. The logic state of devices 327 and 328, thus of device 341, is further conditioned by the state of the output of operational amplifier 3-OA, e.g. comparator 18 (FIGS. 3 and 4) by line 135 which is inputted via line 332 into NAND gate 328 and, after inversion, via line 333 into NAND gate 327.

NOR gates 325, 326 are solid state devices type 4002. NAND gates 327, 328 are solid state devices type 4012. NAND gates 329, 330 and 341 are of the type 4011.

The output from device 330 associated with NAND gate 329 and line 338 is fed via line 182 into the data input (D) of a flip-flop (350) type 4013, which is clocked (pin CK) by the clock signal from line 8. The output from device 341 associated more particularly to NAND gates 327 and 328 is fed via line 182' into the data input (D) of a second flip-flop (351) type 4013, which is also clocked (pin CK) by the clock signal from line 8. The Q state of flip-flop 350 appears on line 82. The $\overline{Q}$ state of flip-flop 351 appears on line 82'. Lines 82, 82' represent the lower limit ($ES_1$) and upper limit ($ES_2$) of the ramp limit detector, schematized by a single line 82 in FIG. 3. These limits control the gating circuit 105 interposed after the hard pulse on line 305 from the monostable multivibrator 30. Before considering the detection of the end-stops $ES_1$, $ES_2$ and the logical state of the signals on lines 82, 82' in relation to the state of comparator (3-OA) as shown on line 135, consideration should be had to gating circuit 105.

Circuit 105 includes NAND gates 352, 353 and 357. Line 82 is connected to one input of device 352, line 82' is connected to one input of device 357. Line 305, which may be passing the hard pulse from the multivibrator, is feeding device 353, the output of which is the second input of device 357, together with line 82'. The output of device 353 provides the second input of device 352. The output of the last NAND gate 357 is on line 29, the hard pulse command line used to command ignition of the "next" thyristor, while on line 358 it is triggering the ring-counter 20 into its "next" state.

The operation of end-stop detector 80 in conjunction with the gating circuit 105, will now be considered in relation to FIG. 7, namely, for successive counts being reached on the ramp being synthesized by $Q_1-Q_9$ at a given firing stage of thyrstor $T_1-T_6$.

From count zero to count eight on the ramp, the electrical angle is before the first end-stop $ES_1$, and therefore, no hard pulse is allowed to pass from multivibrator 30 to lines 29 and 358. In this situation 182' is a zero due to gates 327 and 328 maintaining a ONE on lines 339 and 340 at the input of gate 341. The logic of 182' being ZERO, clock line 8 transfers data ONE as $\overline{Q}$ and line 82' blocks gate 357 which can never pass a ONE on lines 29 and 358 when a hard pulse command would be generated on line 305 via device 353 and line 356.

It is assumed now that count 8, identified by the inputs to devices 325 and 326, corresponding to $\alpha = 7.5°$ stated in the table of truth, is reached. If a hard pulse has been generated previously on line 305 (which could not pass gate 105), comparator 18 is in its second state and a ONE is on line 135. When it is so, since count 8 has been reached (first end stop $ES_1$) the output of device 328 on line 340 becomes a ZERO and 182' receives a ONE. When flip-flop 351 is clocked, $\overline{Q}$ becomes a zero on line 82' and, whatever the state on line 305, a ONE is generated on lines 29 and 358. The clock pulse of line 8 and the nature of $\overline{Q}$ on line 82' are such that the output of device 357 is of the same quality as the hard pulse command which would have been passed directly on line 29, had the gate circuit 105 been omitted. In other words, the clock signal of line 8 on flip-flop 351 causes the generation of a pulse applied on line 29 from line 82' which is a substitute for the hard pulse command previously on line 305 from the multivibrator but which had been blocked by circuit 105.

Once counter 9 has passed state 8, both states of 339 and 340 become a ONE and data on D of flip-flop 351 have become a ONE. 182 and 182' are both zero and upon clocking from line 8, flip-flop 352 and 351 generate a ZERO on line 82 and a ONE on line 82'. Under such conditions, if comparator 18 changes state, on line 305 the generated hard pulse is passed through gates 353 and 357 onto lines 29 and 358. The synthesized timing wave defined by $Q_1-Q_9$ will cause firing at the proper firing angle when a comparator transition occurs within the permissible range, beyond $ES_1$.

Assuming comparator 18 is still in its first state, when count 248 is reached, gate 327 causes 339 to be a ZERO and 182' becomes a ONE. Therefore, as in the case of the lower limit end-stop ($ES_1$), when for the upper limit ($ES_2$) flip-flop 351 is being clocked it generates via line 82' and by device 357, a substitute pulse, which takes the place of the retarded hard pulse, command e.g. a command which has not yet been provided from comparator 18 and multivibrator 30.

Beyond count 248, 82 and 82' are again in a state blocking the transmission of any pulse through gate 105 by the multivibrator (line 305) or locally from flip-flop 351. It appears from the preceding explanations that end-stop detector 80 identifies the instants at which $ES_1$ or $ES_2$ pulses should occur; detects whether a hard pulse command is in advance of the permissible range (comparator state on line 135) and generates in such case a substitute for the multivibrator pulse once $ES_1$ is reached; or detects whether a hard pulse command is retarded (as identified by the comparator state on line 135) and generates in such case a substitute pulse as soon as $ES_2$ is reached. End-stop detector also blocks via lines 82 and 82' gate circuit 105 whenever outside the permissible range, e.g., beyond $ES_2$, or before $ES_1$ on the synthesized ramp.

An all-digital end-stop circuit has been realized which never interferes with the operation of the monostable multivibrator, and therefore it operates only with the outputted hard pulse and with the comparator output. The end-stops are digitally identified without ambiguity at the time the clock signal matches the particular counter state.

Returning to the gate pulse suppression circuit of FIG. 5C, this circuit appears to be a set-reset circuit flip-flop comprised of NOR gates 101, 102 and 103. In the illegal state, namely when a hard pulse on line 29 or a picket fence on line 45 already exists, the gate pulse suppression signal of line 45 will cause on line 207 an inhibit signal to appear which will be effective on NOR devices 365 of NOR circuit 77.

Referring to FIG. 7, gate pulse suppression should be effective only in situations such as #1 or #4, but ineffective when a pulse already exists, such as in situations #2 or #3. Gate pulse suppression, according to the invention, is effective on the outputting of the firing pulses, by the effect of solid state devices 102 and 103 establishing an illegality for situation #2, e.g., with the production of a hard pulse, and of gate 101 providing in addition for the illegality of situation #3. Thus, the free-running picket fence pulses on line 45 would pass gate 101 (as also would the hard pulse on line 29) and be applied to NAND gates 360, from there onto NOR gates 365, but would not pass NOR gate 365 when inhibited by line 207.

I claim:
1. In a digital gate pulse generator for sequentially firing thyristors in accordance with a time reference signal derived from a digital counter, the combination of:
   comparator means operative in relation to said time reference signal and to a firing angle reference signal to assume one of two states;

means responsive to a transition by said comparator means from a first to a second state for generating a hard pulse;

means responsive to a generated hard pulse for causing firing of the "next" thyristor to be set into conduction;

means responsive to said second state of said comparator means for generating a substitute pulse when said counter assumes a predetermined first count and responsive to said first state of said comparator means for generating a substitute pulse when said counter assumes a predetermined second output;

means being provided for preventing firing of said next thyristor in response to a generated hard pulse when the count in said counter is below said first count, and when the count in said counter is above said second count;

said hard pulse responsive means being further responsive to a generated substitute pulse, thereby to cause firing of said "next" thyristor.

2. The pulse generator of claim 1 with means responsive to said digital counter for digitally synthesizing a series of time dependent references in successive order of firing of said thyristors, with means operative with said synthesizing means for detecting said predetermined first and second counts as representing respective first and second end-stops defining a permissive firing angle range on a current one of said time dependent references associated with the "next" thyristor to be fired.

3. The pulse generator of claim 2 with means operative on said synthesizing means in relation to said digital counter for limiting the counts defining a time dependent reference to substantially the span from the first end-stop to the second end-stop.

4. The pulse generator of claim 1 with means responsive to one of said hard and substitute pulses for gating the same to cause firing of said "next" thyristor; means responsive to an external event for suppressing said hard and substitute pulses before the occurrence thereof; and means overriding said suppressing means for preventing suppression by said event in the presence of said hard and substitute pulses.

* * * * *